(12) United States Patent
Lasser et al.

(10) Patent No.: US 7,954,037 B2
(45) Date of Patent: May 31, 2011

(54) METHOD FOR RECOVERING FROM ERRORS IN FLASH MEMORY

(75) Inventors: Menahem Lasser, Kohav-Yair (IL); Mark Murin, Kfar Saba (IL)

(73) Assignee: Sandisk IL Ltd, Kfar Saba (IL)

( * ) Notice: Subject to any disclaimer, the term of this patent is extended or adjusted under 35 U.S.C. 154(b) by 740 days.

(21) Appl. No.: 11/397,609

(22) Filed: Apr. 5, 2006

(65) Prior Publication Data

US 2007/0091677 A1   Apr. 26, 2007

Related U.S. Application Data

(60) Provisional application No. 60/729,608, filed on Oct. 25, 2005.

(51) Int. Cl.
*G11C 29/00* (2006.01)
(52) U.S. Cl. .................................................. 714/763
(58) Field of Classification Search ................. 714/763
See application file for complete search history.

(56) References Cited

U.S. PATENT DOCUMENTS

| | | | |
|---|---|---|---|
| 5,434,825 A | 7/1995 | Harari | |
| 5,657,332 A | 8/1997 | Auclair | |
| 5,724,285 A | 3/1998 | Shinohara | |
| 6,522,580 B2 | 2/2003 | Chen | |
| 6,751,766 B2 | 6/2004 | Guterman et al. | |
| 7,012,835 B2 * | 3/2006 | Gonzalez et al. | 365/185.11 |
| 7,181,572 B2 * | 2/2007 | Walmsley | 711/128 |
| 7,592,829 B2 * | 9/2009 | Walmsley et al. | 326/8 |

(Continued)

FOREIGN PATENT DOCUMENTS

JP   04-337857 A   11/1992

(Continued)

OTHER PUBLICATIONS

EPO/ISA, "Notification of Transmital of the International Search Report and the Written Opinion of the International Searching Authority, or the Declaration," corresponding International Application No. PCT/IL06/01220, mailed on Oct. 27, 2008, 9 pages.

Korean Patent Office, "Notice of Grounds for Rejection," corresponding Korean Patent Application No. 10-2008-7012350, mailed on Feb. 26, 2010, 2 pages (translation only.).

(Continued)

*Primary Examiner* — Scott T Baderman
*Assistant Examiner* — Enam Ahmed
(74) *Attorney, Agent, or Firm* — Davis Wright Tremaine LLP

(57) ABSTRACT

Methods, devices and computer readable code for reading data from one or more flash memory cells, and for recovering from read errors are disclosed. In some embodiments, in the event of an error correction failure by an error detection and correction module, the flash memory cells are re-read at least once using one or more modified reference voltages, for example, until a successful error correction may be carried out. In some embodiments, after successful error correction a subsequent read request is handled without re-writing data (for example, reliable values of the read data) to the flash memory cells in the interim. In some embodiments, reference voltages associated with a reading where errors are corrected may be stored in memory, and retrieved when responding to a subsequent read request. In some embodiments, the modified reference voltages are predetermined reference voltages. Alternatively or additionally, these modified reference voltages may be determined as needed, for example, using randomly generated values or in accordance with information provided by the error detection and correction module. Methods, devices and computer readable code for reading data for situations where there is no error correction failure are also provided.

12 Claims, 8 Drawing Sheets

U.S. PATENT DOCUMENTS

2003/0103406 A1* 6/2003 Tran .................. 365/230.06
2003/0110361 A1  6/2003 Kanehira et al.

FOREIGN PATENT DOCUMENTS

| JP | 09-244961 A | 9/1997 |
| JP | 2003-248631 A | 9/2003 |
| JP | 2005-190622 A | 7/2005 |
| WO | WO 2005/036401 A2 | 4/2005 |
| WO | WO 2005/036401 A3 | 4/2005 |

OTHER PUBLICATIONS

JPO, "Notification of Reasons of Rejection," corresponding Japanese Patent Application No. 2008-537310, mailed on Dec. 14, 2010, 7 pages (including translation.).

State Intellectual Property Office of the People's Republic of China, "Notification of the First Office Action," corresponding Chinese Patent Application No. 200680047669, mailed on Feb. 24, 2011, 12 pages (including translation.).

* cited by examiner

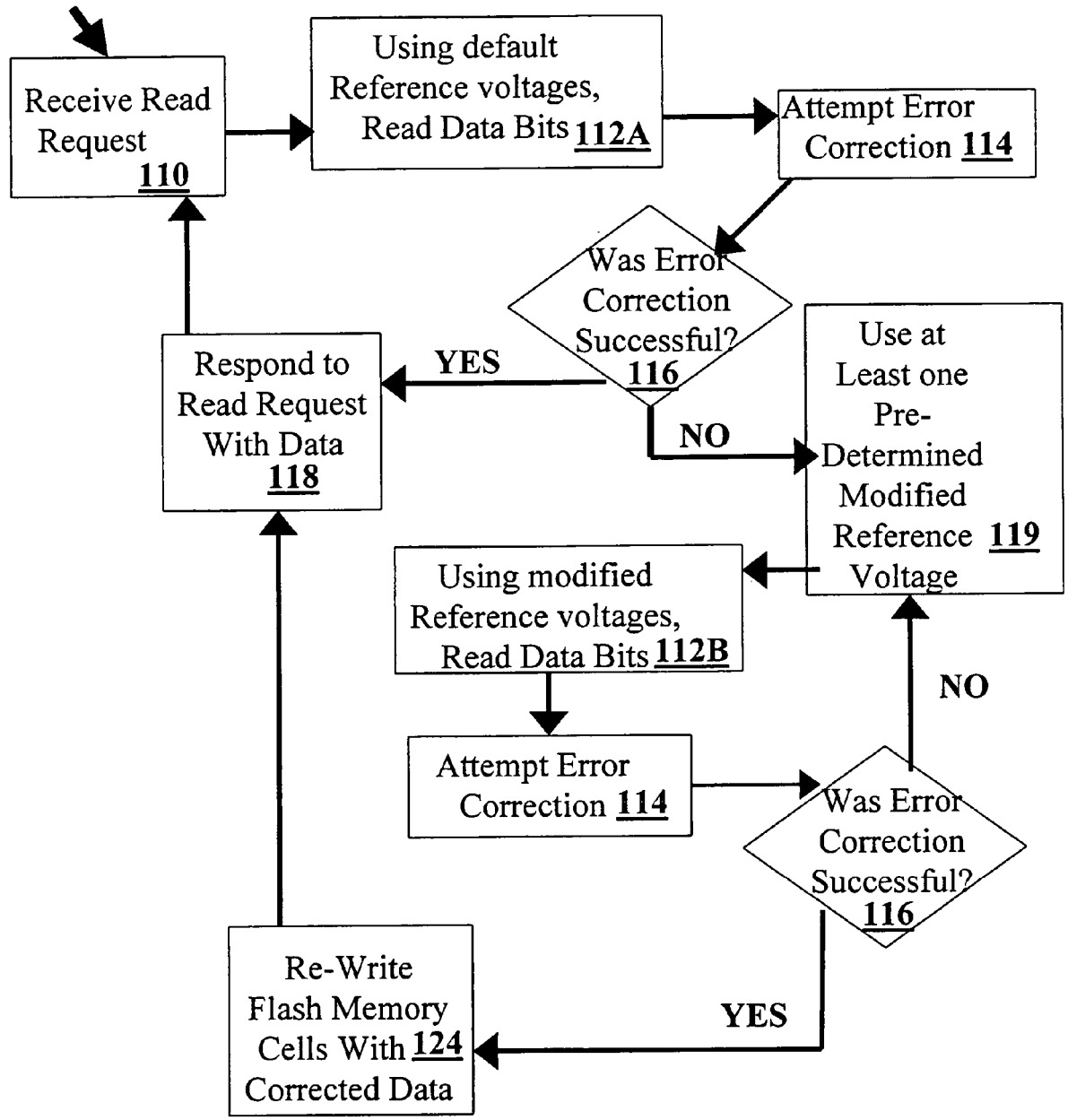
FIG. 2    PRIOR ART

METHOD FOR RECOVERING FROM ERRORS IN FLASH MEMORY

CROSS-REFERENCE TO RELATED APPLICATIONS

This patent application claims the benefit of U.S. Provisional Patent Application No. 60/729,608, filed Oct. 25, 2005 by the present inventors.

FIELD OF THE INVENTION

The present invention relates to reading of data from flash memory in systems where reading errors may occur.

BACKGROUND

Single Bit and Multi-Bit Flash Memory Cells

Flash memory devices have been known for many years. Typically, each memory cell within a flash memory device stores one bit of information. The traditional way to store a bit in a flash memory cell has been by supporting two states of the memory cell. One state represents a logical "0" and the other state represents a logical "1".

In a flash memory cell, the two states are implemented by having a floating gate situated above the cell's channel (the area connecting the source and drain elements of the cell's transistor), and having two valid states for the amount of charge stored within the floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no need to accurately read the cell's threshold voltage—all that is needed is to correctly identify in which of the two states the cell is currently located. For that purpose it is enough to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurities concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also has more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell, but such cells are not in the market yet at the present time. In order to simplify the explanations, the two-bit case is emphasized herein. It should however be understood the present invention is equally applicable to flash memory devices that support any number of bits per cell.) In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one state. As for the SBC case, each state is actually a range and not a single number. When reading the cell's contents, all that must be guaranteed is that the range that the cell's threshold voltage is in is correctly identified. For a prior art example of an MBC flash device see U.S. Pat. No. 5,434,825 to Harari that is included by reference for all purposes as if fully set forth herein.

When encoding two bits in an MBC cell by the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are typically assigned by the following order from left to right—"10", "00", "01". One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of the Chen patent. It should be noted though that there is nothing limiting about this assignment of the states, and that any other ordering can be used. When reading an MBC cell's content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there may also be some drawbacks to using MBC flash—the average read and write times of MBC memories are longer than of SBC memories, resulting in lower performance. Also, the reliability of MBC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there may be advantages to using both MBC cells and SBC cells, depending on the application's requirements.

While the above explanations deal with floating-gate flash memory cells, there are other types of flash memory technologies. For example, in the NROM flash memory technology there is no conductive floating gate but an insulating layer trapping the electric charge. The present invention is equally applicable for all flash memory types, even though the explanations are given in the context of floating-gate technology.

Error Correction When Reading Data from Flash Cells

As explained above, flash cells, and especially MBC flash cells, may be read erroneously in case their threshold voltage drifted away from their initial value. If the amount of threshold voltage drift is large enough, the reading process may find a cell to be in the incorrect side of the reading reference voltage that is used as a border line between two states of the cell. Even though it is common to employ Error Correction Codes (ECC) for correcting errors in data read from flash memory, the correction capability is typically limited to some fixed number of errors within the page of data being read, and eventually the accumulated number of errors might exceed the correction capability of the ECC mechanism.

U.S. Pat. No. 5,657,332 by Auclair et al. entitled "SOFT ERRORS HANDLING IN EEPROM DEVICES" (herein "Auclair") deals with this problem of flash memory errors caused by threshold voltage drifting. That patent is incorporated by reference for all purposes as if fully set forth herein. Auclair proposes two solutions to the errors problem. The first one attempts to eliminate the generation of errors by detecting cells getting close to crossing the border line, and "fixing" them by rewriting their contents back to memory, thus "resetting" the threshold voltages to their correct initial values. The second solution of Auclair accepts the existence of drifting errors as a given fact and attempts to improve the robustness of the memory system after errors are already there. This second solution is discussed in Auclair in column 13 lines 14-27.

The method of Auclair for reading data from flash memory first attempts to do a regular reading using the default value of the reading reference voltage (or multiple reading reference voltages in case of MBC flash memory). Assuming this first reading attempt results in so many errors such that the ECC mechanism fails to correct them, Auclair employs a two-stage recovery plan:

A. The reading reference voltages are changed from their default values to another set of predetermined values, and reading is attempted using the new set of predetermined reference values. Typically the new values will be somewhat lower than the default values. It is reasonable to expect the threshold voltages of the cells to drift to lower values with time (that is—move left in FIGS. 1A and 1B), as the drifting is the result of charge leakage out of the floating gate. Therefore moving the "borders" of comparison left has a good chance of separating the drifted states from each other. If there are still errors in the results of the reading with corrected reference values, they are processed by the ECC mechanism. If there are still too many errors to correct, the process repeats—another set of predetermined reading reference values is chosen and another reading and correction is done. Hopefully, this repeated process ends with data that is successfully corrected and can be assumed to have no errors. Once we get to this point we move to the second stage.

B. The data obtained from the first stage is written back to the cells, so that next time it is read using the default reading reference values, it will not provide so many errors as was the case in the current reading.

FIG. 2 provides a flow chart describing the handling of a read request by a flash device having a controller and a flash memory (i.e. including flash memory cells) in accordance with the prior art technique disclosed in Auclair. After receiving 110 a read request, the flash controller reads 112A data bits from the flash memory 212 using default reference voltages. An attempt 114 is made to effect a correction of the read data bits using the ECC. If the error correction is successful 116, the device may respond 118 to the read request by sending the corrected read data (for example, by sending the data to the host device). After responding 118 to the read request, the device is ready to handle another read request.

If the error correction is not successful 116, the device re-reads 112B data bits from the flash memory using a set of reference voltages including at least one pre-determined modified 119 reference voltages. After re-reading 112B the data bits with one or more "new" pre-determined reference voltages (i.e. using at least pre-determined modified 119 reference voltage), another error correction is attempted 114. In the event of another error correction 116 failure, this process of using different pre-modified 119 reference voltages and re-reading 112B data bits is repeated until the ECC can successfully perform 116 an error correction of the data bits.

At that point, the memory cells are "rejuvenated" in order to reduce the likelihood of error correction failure when the cells are subsequently read (with their "proper" default reference voltages). This is done by taking advantage of the fact after successful error correction, the proper data is now available, and may be re-written 124 into the memory cells. Thus, according to the teaching of Auclair, it is assumed that after data re-write, the next time the data is read 112A using the default reading reference values (i.e. after another read request 110), the flash memory cells will be more likely to provide data with fewer errors (i.e. because the reference voltage "drift" has been corrected), providing read data that may be corrected with the ECC.

It is noted that the aforementioned recovery method of Auclair suffers from a big disadvantage. Every time the recovery process is employed the data is written again. In flash memory the writing operation is much slower than the reading operation. For example in SBC NAND flash memory the writing of a page of data takes approximately 200 microseconds, while the reading of a page of data takes approximately 15 microseconds. The situation is even worse in MBC NAND flash memory, where the writing of a page may take 800 microseconds while the reading of a page may take 30 microseconds. This fact means that employing the method of Auclair for recovering a page of data may be a very slow operation. Typically the software application initiating the read request and waiting for the data expects the data to be available within tens of microseconds, while it might actually have to wait an order of magnitude longer. For real-time software applications, this might be unacceptable. Even if the writing stage of Auclair is delayed to a later time, so that the software application receives the data as soon as it is available and without waiting for the recovery process to complete, there is still a degradation in the throughput of the storage system due to the extra writing operation.

There is thus a need for methods that recover data from flash memory in the presence of errors, while achieving the recovery in a relatively short time.

SUMMARY OF THE INVENTION

Some or all of the aforementioned needs, and other needs, are satisfied by several aspects of the present invention.

It is now disclosed for the first time a method of reading data in a system comprising a plurality of flash memory cells and an error detection and correction module. The presently disclosed method comprises the steps of (a) reading data bits from the plurality of flash memory cells; (b) attempting to correct errors of the read data bits using the error detection and correction module; (c) in the event of an error correction failure by the error detection and correction module, re-reading, at least once, the data bits from the plurality of flash memory cells using at least one modified reference voltage until the module successfully corrects the errors; and d) repeating steps (a), (b) and (c) for the data bits without re-writing the data bits to the memory cells in the interim (i.e. after the successful error correction of step (c) with at least modified reference voltage, and before the reading of step (a)).

According to some embodiments, an initial the reading before the repeating is in response to a first read request, and a subsequent reading associated with the repeating is in response to a subsequent read request.

It is now disclosed for the first time a method of reading data in a system comprising a plurality of flash memory cells and an error detection and correction module. The presently disclosed method comprises the steps of (a) reading data bits from the plurality of flash memory cells; (b) attempting to correct errors of the read data bits using the error detection and correction module; (c) in the event of an error correction failure by the error detection and correction module, re-reading, at least once, the data bits from the plurality of flash memory cells using at least one modified reference voltage until the module successfully corrects the errors; (d) subsequent to the correcting, storing at least one read reference voltage for which the module successfully corrected the errors; (e) subsequent to the storing, retrieving the stored at least one read reference voltage; and g) subsequent to the retrieving, reading the data bits from the plurality of flash memory cells using the retrieved at least one read reference voltage.

The at least one read reference voltage may be stored in any combination of volatile and/or non-volatile memory.

According to some embodiments, at least one read reference voltage is stored in one or more of the flash memory cells.

According to some embodiments, the read data bits are read using a flash controller, and at least one read reference voltage is stored in the flash controller (i.e. in any combination of volatile and/or non-volatile memory of the flash controller).

According to some embodiments, an initial reading before the storing is in response to a first read request, and a subsequent reading using the retrieved at least one read reference voltage is in response to a subsequent read request.

It is now disclosed for the first time a method of reading data in a system comprising a plurality of flash memory cells and an error detection and correction module. The presently disclosed method comprises the steps of (a) reading data bits from the plurality of flash memory cells; b) attempting to correct errors of the read data bits using the error detection and correction module; c) in the event of an error correction failure by the error detection and correction module and subsequent to the reading, deriving at least one new read reference voltage; and d) reading the data bits from the plurality of flash memory cells using the derived at least one new read reference voltage.

According to some embodiments, the derived at least one new voltage is determined at least in part in accordance with information provided by the error detection and correction module.

According to some embodiments, the derived at least one new voltage is determined at least in part randomly.

It is now disclosed for the first time a method of reading data in a system comprising a plurality of flash memory cells and an error detection and correction module. The presently disclosed method comprises the steps of (a) reading data bits from the plurality of flash memory cells; b) correcting errors of the read data bits using the error detection and correction module; and c) subsequent to the correcting, reading the data bits from the plurality of flash memory cells using at least one modified reference voltage.

According to some embodiments, the subsequent reading of the data bits using at least one modified reference voltage is carried out even if there is no error correction failure by the error correction detection and correction module in the interim (i.e. after the reading of the data bits of step (a) and before the re-reading with the at least one modified reference voltage).

According to some embodiments, the plurality of memory cells are not written after the correcting and before the reading using the at least one modified reference voltage.

According to some embodiments, at least one modified reference voltage is derived in accordance at least in part with information (for example, information indicative of a number of errors) provided by the error detection and correction module.

According to some embodiments, an initial reading before the correcting is in response to a first read request, and the subsequent reading after the correcting is in response to a subsequent read request.

It is now disclosed for the first time a flash memory device for data storage comprising a) a plurality of flash memory cells for storing data bits; b) an error detection and correction module for detecting and correcting errors in the data bits; and c) a controller for reading the data bits from the memory cells, wherein: (i) the controller is operative to respond to a first read request by reading data bits from the plurality of flash memory cells and, if the error detection and correction module fails to correct the data bits, re-read the data bits using at least one modified reference voltage until the module successfully corrects the errors; and ii) the controller is further operative to repeat the response for a subsequent read request without re-writing the data bits to the memory cells in the interim. (i.e. after the successful error correction associated with the re-reading of data bits for the first read request, and before the first reading of data bits associated with a first subsequent read request).

It is now disclosed for the first time a flash memory device for data storage comprising a) a plurality of flash memory cells for storing data bits; b) an error detection and correction module for detecting and correcting errors in the data bits; and c) a controller for reading the data bits from the memory cells, wherein: (I) the controller is operative to respond to a first read request by: i) reading data bits from the plurality of flash memory cells; ii) attempting to correct errors of the read data bits using the error detection and correction module; iii) in the event of an error correction failure by the error detection and correction module, re-reading, at least once, the data bits from the plurality of flash memory cells using at least one modified reference voltage until the module successfully corrects the errors; and iv) subsequent to the correcting, storing (for example, in auxiliary memory of the controller, or in any other memory), at least one read reference voltage for which the module successfully corrected the errors; and, subsequent to the storing, (II) the controller is further operative to respond to a subsequent read request by: i) retrieving the stored at least one read reference voltage; and ii) subsequent to the retrieving, reading the data bits from the plurality of flash memory cells using the retrieved at least one read reference voltage.

According to some embodiments, the controller is operative to store at least one read reference voltage in volatile memory.

According to some embodiments, the controller is operative to store at least one read reference voltage in non-volatile memory.

According to some embodiments, the controller is operative to store at least one read reference voltage in one or more the flash memory cells.

According to some embodiments, the controller is operative to store at least one read reference voltage in the controller (e.g. volatile and/or non-volatile memory of the flash controller).

It is now disclosed for the first time a flash memory device for data storage comprising a) a plurality of flash memory cells for storing data bits; b) an error detection and correction module for detecting errors in the data bits; and c) a controller for reading the data bits from the flash memory cells, wherein the controller is operative to respond to a read request by: (i) reading the data bits from the plurality of flash memory cells; (ii) attempting to correct errors of the read data bits using the error detection and correction module; (iii) in the event of an error correction failure by the error detection and correction module and subsequent to the reading, deriving at least one new read reference voltage, and (iv) reading the data bits from the plurality of flash memory cells using the derived at least one new read reference voltage According to some embodiments, the controller is operative to derive the at least one new voltage at least in part in accordance with information provided by the error detection and correction module.

According to some embodiments, the controller is operative to derive the at least one new voltage at least in part randomly.

It is now disclosed for the first time a flash memory device for data storage comprising a) a plurality of flash memory cells for storing data bits; b) an error detection and correction module for detecting errors in the data bits; and c) a controller for reading the data bits from the flash memory cells, wherein (I) the controller is operative to respond to a first read request by: i) reading data bits from the plurality of flash memory cells; and ii) correcting errors of said read data bits, using said error detection and correction module, and (II) the controller is further operative to respond to a subsequent read request by: iii) reading the data bits from the plurality of flash memory cells using at least one modified reference voltage.

According to some embodiments, the controller is operative to respond to the first and the subsequent read requests without writing to the plurality of memory cells after the correcting and before the reading using the at least one modified reference voltage.

According to some embodiments, the controller is operative to derive at least one modified reference voltage in accordance at least in part with information provided by the error detection and correction module.

A computer readable storage medium having computer readable code embodied in the computer readable storage medium, the computer readable code comprising instructions for reading data in a system comprising a plurality of flash memory cells and an error detection and correction module, wherein the instructions comprise instructions to: a) read data bits from the plurality of flash memory cells; b) attempt to correct errors of the read data bits using the error detection and correction module; c) in the event of an error correction failure by the error detection and correction module, re-read, at least once, the data bits from the plurality of flash memory cells using at least one modified reference voltage until the module successfully corrects the errors; and d) repeat steps (a), (b) and (c) without writing rewriting the data bits to the memory cells in the interim. (i.e. after the successful error correction of step (c) with at least modified reference voltage, and before the reading of step (a)).

It is now disclosed for the first time a computer readable storage medium having computer readable code embodied in the computer readable storage medium, the computer readable code comprising instructions for reading data in a system comprising a plurality of flash memory cells and an error detection and correction module, wherein the instructions comprise instructions to: a) read data bits from the plurality of flash memory cells; b) attempt to correct errors of the read data bits using the error detection and correction module; c) in the event of an error correction failure by the error detection and correction module, re-read, at least once, the data bits from the plurality of flash memory cells using at least one modified reference voltage until the module successfully corrects the errors; d) subsequent to the correcting, store at least one read reference voltage for which the module successfully corrected the errors; e) subsequent to the storing, retrieve the stored at least one read reference voltage; and g) subsequent to the retrieving, read the data bits from the plurality of flash memory cells using the retrieved at least one read reference voltage.

It is now disclosed for the first time a computer readable storage medium having computer readable code embodied in the computer readable storage medium, the computer readable code comprising instructions for reading data in a system comprising a plurality of flash memory cells and an error detection and correction module, wherein the instructions comprise instructions to: a) read data bits from the plurality of flash memory cells; b) attempt to correct errors of the read data bits using the error detection and correction module; c) in the event of an error correction failure by the error detection and correction module and subsequent to the reading, derive at least one new read reference voltage; and d) read the data bits from the plurality of flash memory cells using the derived at least one new read reference voltage.

A computer readable storage medium having computer readable code embodied in the computer readable storage medium, the computer readable code comprising instructions for reading data in a system comprising a plurality of flash memory cells and an error detection and correction module, wherein the instructions comprise instructions to: a) read data bits from the plurality of flash memory cells; b) correct errors of the read data bits using the error detection and correction module; and c) subsequent to the correcting, read the data bits from the plurality of flash memory cells using at least one modified reference voltage.

These and further embodiments will be apparent from the detailed description and examples that follow.

BRIEF DESCRIPTION OF THE DRAWINGS

FIG. 2 provides a flow-chart describing as prior art error recovery scheme.

DETAILED DESCRIPTION

The present invention will now be described in terms of specific, example embodiments. It is to be understood that the invention is not limited to the example embodiments disclosed. It should also be understood that not every feature of the presently disclosed method, device and computer-readable code for recovering from errors in flash memory is necessary to implement the invention as claimed in any particular one of the appended claims. Various elements and features of devices are described to fully enable the invention. It should also be understood that throughout this disclosure, where a process or method is shown or described, the steps of the method may be performed in any order or simultaneously, unless it is clear from the context that one step depends on another being performed first.

Figure 1A:
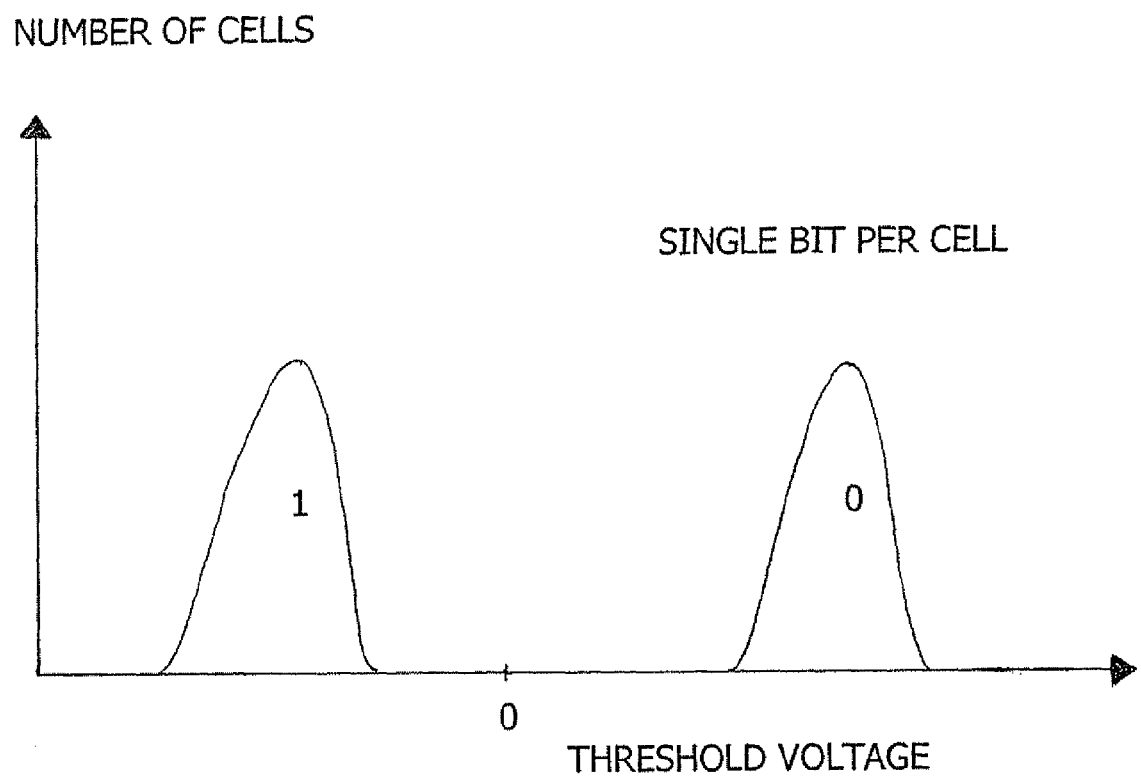
FIGS. 1A-1B provide a graphical illustration of distributions of thresholds voltages of a large population of memory cells (prior art).
Figure 1B:
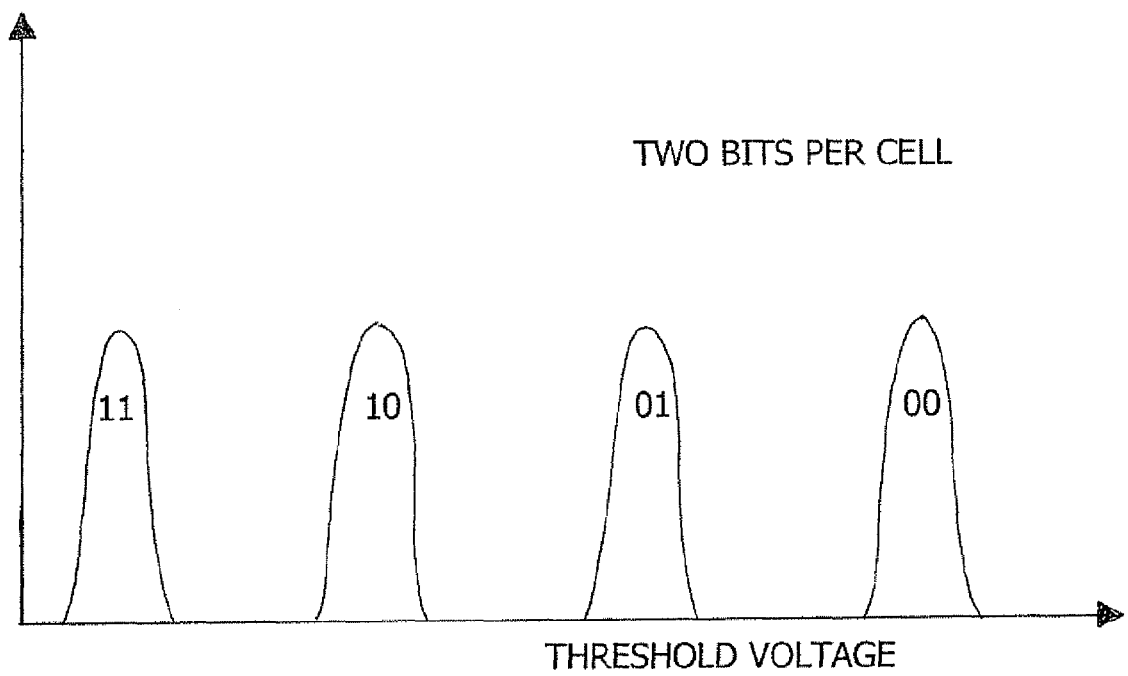
Figure 3:
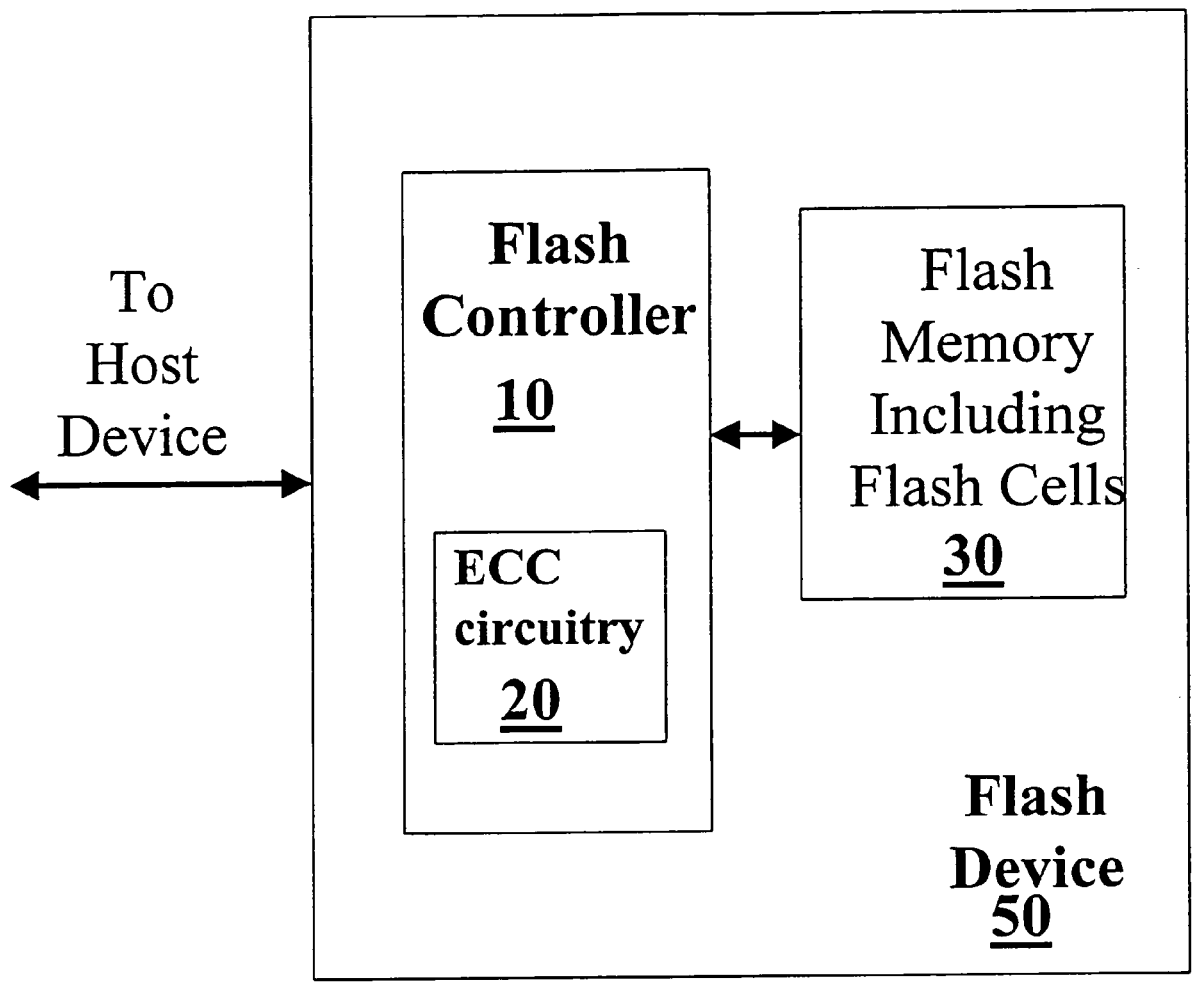
FIG. 3 provides a block diagram of a flash memory device in accordance with exemplary embodiments of the present invention.

Flash Memory Device of FIG. 3

FIG. 3 provides a block diagram of a flash memory device 50 in accordance with exemplary embodiments of the present invention. The flash memory device 50 includes a flash memory 30 having a plurality of flash memory cells, and a flash controller 10. The flash controller 10 is operative to read data from the flash memory cells 30, and optionally, is also operative to write data into the flash memory cells 30. The flash device 50 also includes error detection and correction circuitry 20, either as part of the flash controller 10 (as shown in FIG. 3), or separately. The flash controller 10 may access the flash memory 30 in accordance with instructions received from outside of the flash device 50, for example, from a host device (not shown).

Figure 4:
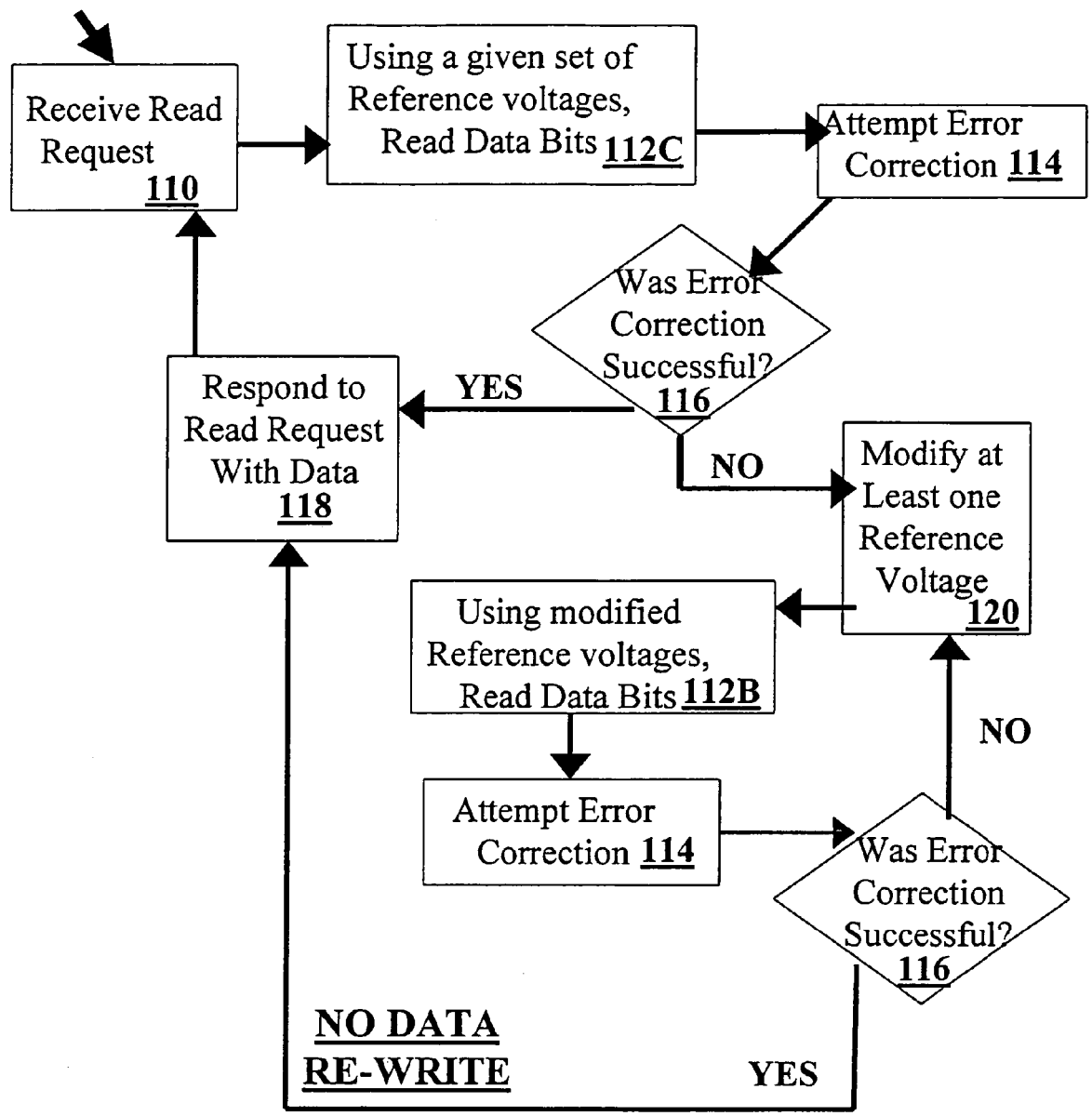
FIGS. 4-7 each provide a flow chart describing the handling of one or more read requests by the flash device in accordance with some embodiments of the present invention.

Description of FIG. 4

FIG. 4 provides a flow chart describing the handling of one or more read requests by the flash device 50 in accordance with some embodiments of the present invention. After receiving 110 a read request, the flash controller 10 reads 112C data bits from the flash memory 30 using a set of reference voltages (for example, default reference voltages, or any other set of reference voltages—thus each memory cell is read using a respective reference voltage). An attempt 114 is made to effect a correction of the read data bits using the ECC. If the error correction is successful 116, the controller 10 may respond 118 to the read request by sending the corrected data (for example, to the host device). After responding 118 to the read request, the device 50 is ready to handle another read request.

If the error correction is not successful 116, the controller 10 may re-read 112B data bits from the flash memory using at least one modified 120 reference voltage (i.e. where at least one respective voltage differs from that used in the previous read—112C). After the re-reading 112B, an additional error correction is once again attempted 114. If this error correction is not successful 116, the controller 10 may read 112B the data bits from the memory cells 30 yet another time using at least one modified reference voltage (i.e. where at least one respective voltage differs from that used in the previous read—112B). The re-reading 112B with modified voltages and the attempted error corrections 114 are repeated until there is a successful error correction 116.

At this point, a response 118 may be sent to the read request, and the controller is ready to respond to another read request 110. It is noted that in accordance with embodiments described in FIG. 4, after the successful error correction the data is not re-written into the flash memory cells.

It is noted that in FIG. 4, the error recover process includes re-reading 112B the flash memory cells at least once using modified 120 reference voltages. Although not a requirement of FIG. 4, in some embodiments, the sequence of modified reference voltages may be pre-determined, and for each iteration, a different set of pre-determined reference voltages may be used. Alternatively, one or more modified reference voltages may be calculated, for example, using a microprocessor of the flash controller 10.

Discussion Related to FIG. 4

Because the data is not re-written, it is likely that the same data errors that were encountered when handling a first read request may, once again, be encountered when handling subsequent reading requests (i.e. because the memory cells were not rejuvenated with re-written data to reduce the likelihood of error correction failure when using default voltages). Thus, the device would, while handling the subsequent reading request, need to, once again, invoke an error recovery procedure, for example, the procedure described in FIG. 4.

The present inventors are now disclosing for the first time that, in many situations, the speed benefit gain associated with eliminating the time-consuming step of re-writing data into the flash memory (see 124 of FIG. 2) (i.e. by invoking a faster recovery procedure) may outweigh the loss of efficiency associated with multiple read iterations, and the need to more frequently recover from reading errors. Thus, the present inventors are disclosing that there are many situations where the procedure of FIG. 4 is, on average, faster, than that of FIG. 2.

Figure 5:
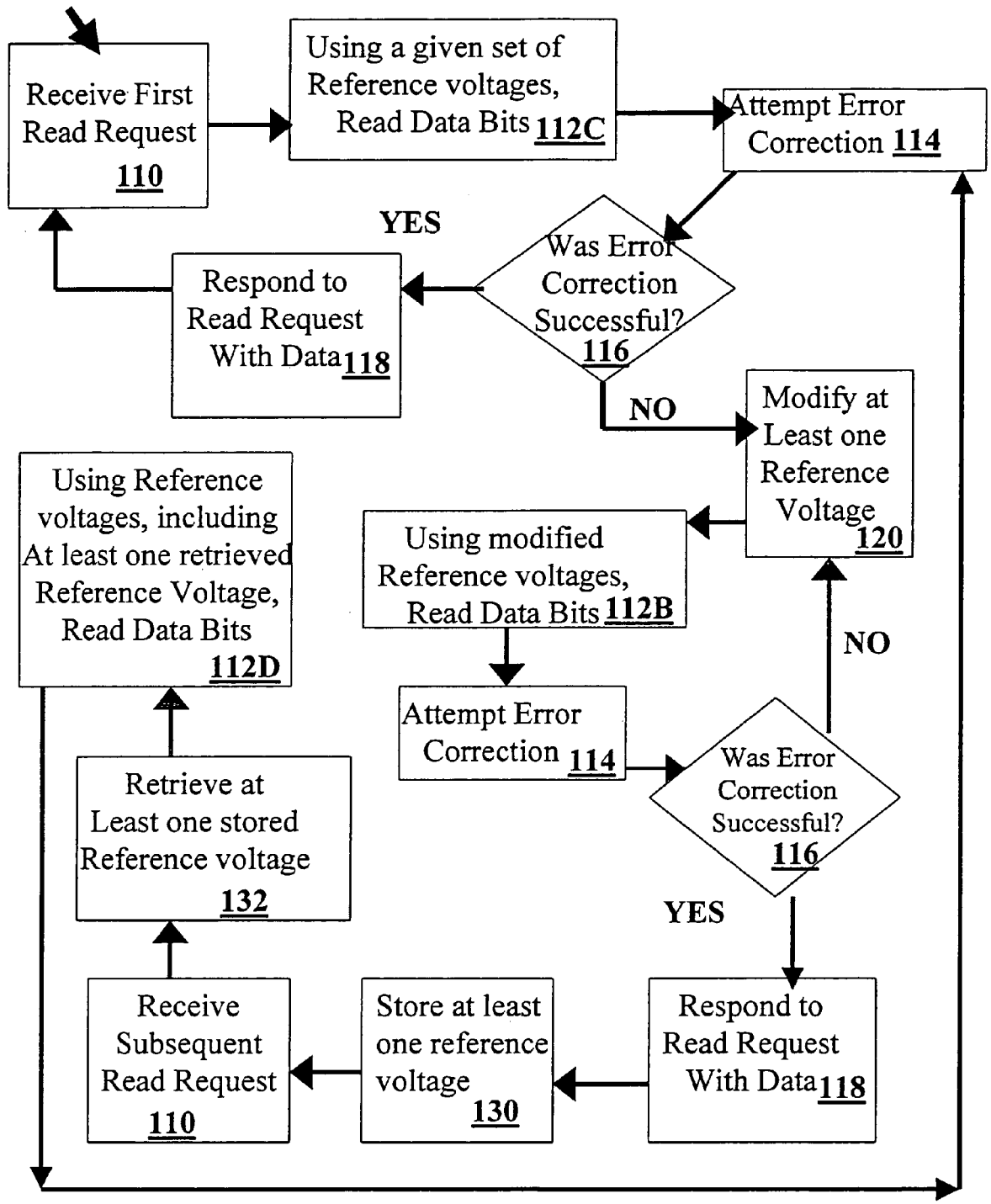

Description of FIG. 5

FIG. 5 provides a flow chart describing the handling of one or more read requests by the flash device 50 in accordance with some embodiments of the present invention. After receiving 110 a read request, the flash controller 10 reads 112C data bits from the flash memory 30 using a set of reference voltages (for example, default reference voltages, or any other set of reference voltages—thus each memory cell is read using a respective reference voltage). An attempt 114 is made to effect a correction of the read data bits using the ECC. If the error correction is successful 116, the controller 10 may respond 118 to the read request by sending the corrected data (for example, to the host device). After responding 118 to the read request, the device 50 is ready to handle another read request.

If the error correction is not successful 116, the controller 10 may re-read 112B data bits from the flash memory using at least one modified 120 reference voltage (i.e. where at least one respective voltage differs from that used in the previous read—112C). After the re-reading 112B, an additional error correction is once again attempted 114. If this error correction is not successful 116, the controller 10 may read 112B the data bits from the memory cells 30 yet another time using at least one modified reference voltage (i.e. where at least one respective voltage differs from that used in the previous read—112B). The re-reading 112B with modified voltages and the attempted error corrections 114 is repeated until there is a successful error correction 116.

At this point, a response 118 may be sent to the read request.

According to the embodiment depicted in FIG. 5, after the successful error correction 116 (i.e. after successful recovery), one or more of the "successful" reference voltages 130 may be stored in memory, for later use.

Upon receiving a subsequent read request 110, one or more of these stored reference voltages (i.e. stored 130 after a successful recovery when handling a previous read request) may be retrieved 132, and used when reading 112D flash memory to handle the subsequent read request.

Although not written explicitly in FIG. 5 and not a limitation of FIG. 5, it is appreciated that, in some embodiments, as in FIG. 4, the actual data retrieved from the flash cells need not be re-written into the flash cells.

Discussion of FIG. 5

Although not a limitation, FIG. 5 may be thought of as an "improvement" to what was disclosed above when describing FIG. 4. In the description of FIG. 4 above, it was noted that because data is not re-written to the flash memory cells (i.e. in order to avoid the time-consuming flash write operation), the same errors may be encountered when handling subsequent reading requests (i.e. because the memory cells were not rejuvenated with re-written data to reduce the likelihood of error correction failure when using default voltages).

The procedure of FIG. 5 may be useful for reducing the number of reading iterations required when responding to a subsequent read request after error recovery. More specifically, in many situations, the stored successful reference voltages (i.e. from a previous read request) are likely to provide a good first approximation of appropriate reference voltages in a subsequent read request. Thus, by storing these reference voltages after error recovery and retrieving these voltages later, yet another net gain in speed is attainable.

For example, suppose in an SBC flash (where there is only one read reference value) that the read reference for one particular flash cell is modified (i.e. step 120) by 25 millivolts in each successive iteration. If the actual drift by which the cells' threshold voltages had drifted is 100 millivolts, then the first attempt (i.e. step 112C) to read the data will succeed after 5 reading iterations (assuming for simplicity that the default read reference value is very close to the edge of the distribution without a safety margin, which is typically not the case in flash memory devices). Following the successful reading, the value of 100 millivolts is stored for later use.

After receiving a subsequent read request, when that data is read 112D again, the stored value of 100 millivolts is retrieved and used. According to one embodiments (i.e. as illustrated in FIG. 5), the default reading may be skipped and the reading may start with a reference that is 100 millivolts away from the default value. Alternatively, upon receiving a subsequent read request, an initial reading using default reference voltages may be attempted, and only upon failing to correct the data will an attempt reading with the 100 millivolt shifted value by made. This way an overhead of only one or two reading iterations is incurred instead of five.

It is noted that the successful reference values for the various pages of flash memory (the chunks of reading) may be stored 130 in volatile memory, non-volatile memory, or any combination thereof. For example, the successful reference values may be stored 130 in tables in RAM within the flash controller, or inside the flash device. Storing in RAM is fast and efficient, thus serving the purpose of speeding up the process. The drawback is that once power is shut down the stored references are lost. However, this still may be acceptable, as the stored values may not be essential for the memory system operation. If a stored reference value of a chunk of data is lost, then on next reading of that chunk of data, the slower full iterative process may initially be used (for example, as described in FIG. 4), but data still may be correctly retrieved.

Figure 6:
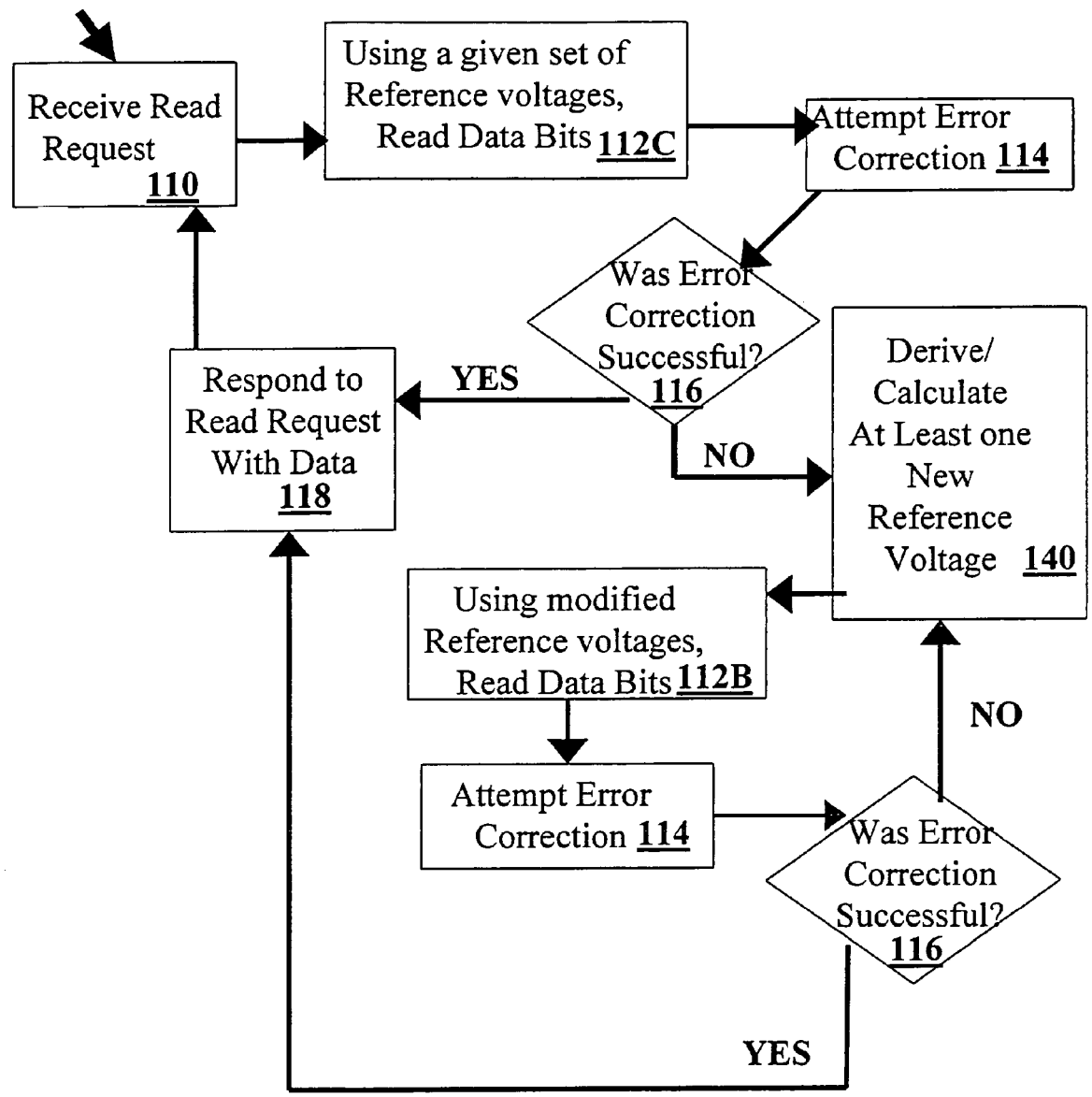

Description and Discussion of FIG. 6

In FIG. 4, it is noted that there is no limitation in how a reference voltage may be modified 120. In FIG. 6, it is disclosed that at least one voltage may be derived 140 or calculated in a certain way (for example, using a microprocessor of the flash controller 10). In this section, two exemplary procedures for deriving or calculating 140 one or more reference voltages will be described. The first procedure relates to calculating 140 a reference voltage in accordance with information provided by an ECC module, and the second procedure relates to deriving 140 the reference voltage using randomly selected voltages. Although not explicitly written in FIGS. 5 or 6, it is noted that typically, the data is not re-written to the flash memory cells after data recovery.

A First Procedure for Deriving 140 Reference Voltages

In some embodiments (and as illustrated in FIG. 6), it may be possible to use to advantage information provided by the ECC module when it fails to correct data. For example, some ECC methods can be configured to provide an indication of the severity of the errors in the data they fail to correct. Severity of errors in this context typically means the number of errors in the data. So even though the exact errors may not be known to the ECC module (and even their exact number may not be known), there still may be information indicating whether the number of errors is high or low. When utilizing an ECC module that can provide such information, this can be used for reducing the number of reading iterations. It is reasonable to expect that a large number of errors is correlated with a large drift of the threshold voltages, while a smaller number of errors is correlated with a smaller drift.

In its simplest form, when only a binary "large/small number of errors" indication is provided by the ECC module, this embodiment operates as follows. When a first default-value-based reading fails, the ECC module is queried for the severity of the errors. Then the next reading attempt is done using reference values that are determined based on this severity. A large shift of reference values may be used if there are many errors, and a smaller shift may be used if there are errors. This way there is a higher probability that the next reading attempt will succeed and the average number of reading iterations per reading operation will reduced.

It is noted that by deriving the reference voltages used for each iterations (for example, in accordance with information provided by an ECC module), an error recovery scheme where the reference voltages are not pre-determined may be provided. Thus, the sequence of reference voltages may be different for different pages of data, and may even be different for two reading operations of the same page.

Obviously, if it turns out that our prediction of reference voltage has failed, it is always possible to revert to a scheme described in FIG. 4 or FIG. 5, or to any other scheme.

A Second Procedure for Deriving 140 Reference Voltages

There are many cases where it is desirable to randomly derive 140 at least one reference voltage during error recovery, rather than to use a predetermined value. For example, if the ECC module cannot provide information on the severity of the errors, as is the case with many simple ECC schemes such as BCH or Hamming codes, it may not be possible to select the read reference voltages according to information derived from the data bits. Thus, it may be desired to use randomly values. The random selection may have an advantage over predetermined selection when there is a large variation in the possible amount of drift between different pages. Using random selection may provides for averaging of the number of reading iterations per reading operation and thus may provide more stable performance that is less dependent on the specific flash device installed in the system.

Figure 7:
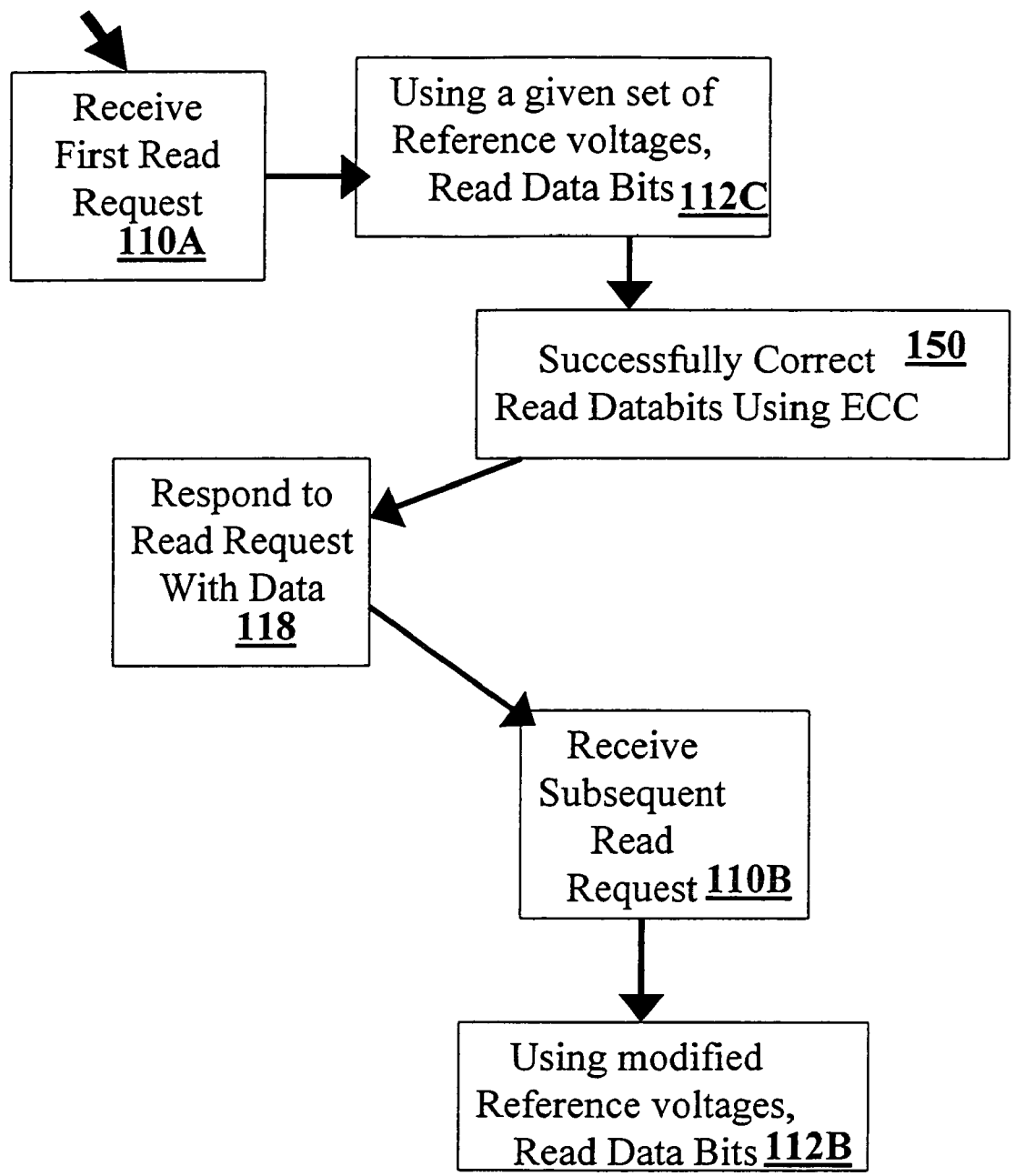

Description and Discussion of FIG. 7

Error recovery procedures where data cells are re-read using modified voltages (i.e. either pre-determined modified voltages, or "newly" calculated voltages) have been described.

Nevertheless, it is noted that the present invention also provides a procedure for reading data from flash memory cells even in situations when an initial reading of the data is successful.

Referring to FIG. 7, it is noted that after receiving a first read request 110A, the flash data cells are read 112C using a given set of reference voltages (for example, default reference voltages). The read data is successfully corrected 150 using the ECC, and a respond may be provided 118 to the first read request.

Although the data is successfully read and corrected in response to a first request 110A (i.e. there was no need for an error recovery routine), in response to a second read request 110B, modified reference voltages are, nevertheless, Typically, the reference voltages are modified in accordance with information provided by the ECC after correcting read data of the first read request, though this is not a limitation. In particular, it is noted that most ECC schemes, if successful in correcting the data, can provide information on the number of errors corrected. Therefore there is an available indication of the severity of the corrected errors, even though the severity may not be very high in the case of "successful error correction" as otherwise the correction would have failed. Based on this indication, it may be determined if the severity is high enough to justify the adjustment of the read reference voltage that will be the starting point for the next read request of the same data. Starting from the adjusted value may save one or more reading iterations on next reading. As in the embodiment described in FIG. 5, the reference voltages to be used for various data pages may be stored for later use, in any combination of volatile (such as RAM) and/or non-volatile memory (such as flash memory).

Thus, it is noted that the reading using modified reference voltages 112B may be carried out even if there is no error correction failure by the error detection and correction module after the initial reading of the data bits 112C.

General Discussion of Exemplary Embodiments

Embodiments of the present invention relates to methods for reading data from a flash memory device, as described above. Some embodiments provide a flash memory controller operative to read from an array of flash memory cells in accordance with any of the method described herein. Some embodiments of the present invention provide a flash memory device that combines an array of flash memory cells with a flash memory controller that reads from the array according to any presently disclosed method It should be understood that the present invention is equally applicable to both SBC and MBC flash memories. In an SBC cell there is only one read reference voltage, while in an MBC cell there are multiple read reference voltages. The presently disclosed procedures for reading flash memory cells apply to both cases, where in the MBC case the shifting of references may be applied to all references in parallel or separately to each reference voltage.

A Discussion of Error Correction Failures

In some embodiments, an "ECC failure" event occurs if the device indicates an ECC failure (for example, if there are more than a pre-determined number of errors per chunk of data of a given size). Nevertheless, this is not a limitation of the present invention. For example, it may determined that even when the ECC module indicates successful error correction, that an "error correction failure" event, has indeed occurred according to alternative pre-determined "error correction failure" criteria related to the number and/or types of errors in a read chunk of data.

Thus, embodiments of the present invention (and in particular, embodiments described with reference to FIGS. 3-6) relate to the case where pre-determined criteria for defining what is an "error correction failure event" that differ from those of the ECC module, are used by the flash memory controller 10.

According to one example, it is not desirable to rely on the ECC module if the ECC module is operating close to its maximal errors correction capability. Suppose for example that the ECC module can correct up to four errors in a data chunk that is read from the flash memory. According to this example, it may be assumed that while correcting three or less errors is highly reliable, correcting four errors is not to be relied on (i.e. this is one example of "pre-determined criteria" for an error correction failure events—the number of errors per data chunk exceeding a pre-determined value). This is because when there are four errors there is some nonzero probability that the true data is not what the ECC module returns, but something different. Therefore one may elect to treat the case of four errors as a correction failure and to employ error recovery techniques provided by some embodiments of the present invention (for example, those disclosed in FIG. 4-6) to obtain a more reliable reading, despite the fact that the ECC may be able to actually propose a correction. Thus, the exemplary case applies to any embodiments described herein, and it should be understood that the term "fails to correct the errors" also encompasses "either fails to correct the errors or the correction is considered not to be reliable according to other pre-determined error criteria".

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

All references cited herein are incorporated by reference in their entirety. Citation of a reference does not constitute an admission that the reference is prior art.

The articles "a" and "an" are used herein to refer to one or to more than one. (i.e., to at least one) of the grammatical object of the article. By way of example, "an element" means one element or more than one element.

The term "including" is used herein to mean, and is used interchangeably with, the phrase "including but not limited" to.

The term "or" is used herein to mean, and is used interchangeably with, the term "and/or," unless context clearly indicates otherwise.

The term "such as" is used herein to mean, and is used interchangeably, with the phrase "such as but not limited to".

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art.

What is claimed is:

1. In a system comprising a plurality of flash memory cells and an error detection and correction module, a method of reading data, the method comprising:
   a) reading data bits from the plurality of flash memory cells;
   b) attempting to correct errors of said read data bits using the error detection and correction module;
   c) in the event of an error correction failure by the error detection and correction module, re-reading, at least once, said data bits from the plurality of flash memory cells using at least one modified reference voltage until the module successfully corrects said errors;
   d) subsequent to said correcting, storing at least one read reference voltage for which the module successfully corrected said errors;
   e) subsequent to said storing, retrieving said stored at least one read reference voltage; and
   f) subsequent to said retrieving, reading the data bits from the plurality of flash memory cells using said retrieved at least one read reference voltage,
   wherein said reading is performed without resulting in re-writing said data bits to the memory cells.

2. The method of claim 1 wherein at least one said read reference voltage is stored in volatile memory.

3. The method of claim 1 wherein at least one said read reference voltage is stored in non-volatile memory.

4. The method of claim 1 wherein at least one said read reference voltage is stored in one or more of the flash memory cells.

5. The method of claim 1 wherein said read data bits are read using a flash controller, and at least one said read reference voltage is stored in said flash controller.

6. The method of claim 1 wherein an initial said reading before said storing is in response to a first read request, and a subsequent reading using said retrieved at least one read reference voltage is in response to a subsequent read request.

7. A flash memory device for data storage, the device comprising:
   a) a plurality of flash memory cells for storing data bits;
   b) an error detection and correction module for detecting and correcting errors in said data bits; and
   c) a controller for reading said data bits from said flash memory cells, wherein said controller is operative to respond to a first read request by:
      i) reading data bits from the plurality of flash memory cells;
      ii) attempting to correct errors of said read data bits using said error detection and correction module;
      iii) in the event of an error correction failure by the error detection and correction module, re-reading, at least once, the data bits from said plurality of flash memory cells using at least one modified reference voltage until said module successfully corrects said errors; and
      iv) subsequent to said correcting, storing, at least one read reference voltage for which the module successfully corrected said errors;
   and, subsequent to said storing, said controller is further operative to respond to a subsequent read request by:
      i) retrieving said stored at least one read reference voltage; and
      ii) subsequent to said retrieving, reading the data bits from the plurality of flash memory cells using said retrieved at least one read reference voltage,
   wherein said reading is performed without resulting in re-writing said data bits to the memory cells.

8. The device of claim 7 wherein said controller is operative to store at least one said read reference voltage in volatile memory.

9. The device of claim 7 wherein said controller is operative to store at least one said read reference voltage in non-volatile memory.

10. The device of claim 7 wherein said controller is operative to store at least one said read reference voltage in one or more said flash memory cells.

11. The device of claim 7 wherein said controller is operative to store at least one said read reference voltage in said controller.

12. A computer readable storage medium having computer readable code embodied in said computer readable storage medium, said computer readable code comprising instructions for reading data in a system comprising a plurality of flash memory cells and an error detection and correction module, wherein said instructions comprise instructions to:
   a) read data bits from the plurality of flash memory cells;
   b) attempt to correct errors of said read data bits using the error detection and correction module;
   c) in the event of an error correction failure by the error detection and correction module, re-read, at least once, said data bits from the plurality of flash memory cells using at least one modified reference voltage until the module successfully corrects said errors;
   d) subsequent to said correcting, store at least one read reference voltage for which the module successfully corrected said errors;
   e) subsequent to said storing, retrieve said stored at least one read reference voltage; and
   f) subsequent to said retrieving, read the data bits from the plurality of flash memory cells using said retrieved at least one read reference voltage,
   wherein said reading is performed without resulting in re-writing said data bits to the memory cells.

* * * * *